United States Patent
Bao et al.

(10) Patent No.: US 11,804,522 B2
(45) Date of Patent: Oct. 31, 2023

(54) SIDEWALL EPITAXY ENCAPSULATION FOR NANOSHEET I/O DEVICE

(71) Applicant: International Business Machines Corporation, Armonk, NY (US)

(72) Inventors: Ruqiang Bao, Niskayuna, NY (US); Shogo Mochizuki, Mechanicville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/644,463

(22) Filed: Dec. 15, 2021

(65) Prior Publication Data

US 2023/0187496 A1 Jun. 15, 2023

(51) Int. Cl.
*H01L 29/06* (2006.01)
*H01L 29/786* (2006.01)
*H01L 29/66* (2006.01)
*H01L 29/423* (2006.01)

(52) U.S. Cl.
CPC .... *H01L 29/0673* (2013.01); *H01L 29/42392* (2013.01); *H01L 29/66545* (2013.01); *H01L 29/78696* (2013.01)

(58) Field of Classification Search
CPC ........... H01L 29/0673; H01L 29/42392; H01L 29/66545; H01L 29/78696; H01L 29/66742; H01L 29/0653; H01L 29/1079
See application file for complete search history.

(56) References Cited

U.S. PATENT DOCUMENTS

| | | | |
|---|---|---|---|
| 7,816,275 | B1 | 10/2010 | Fuller |
| 9,293,586 | B2 | 3/2016 | Hu |
| 9,620,590 | B1 | 4/2017 | Bergendahl |
| 9,741,792 | B2 | 8/2017 | Cheng |
| 9,881,998 | B1 | 1/2018 | Cheng |
| 9,917,210 | B1 | 3/2018 | Bao |
| 9,947,804 | B1 | 4/2018 | Frougier |
| 10,109,533 | B1 | 10/2018 | Xie |
| 10,312,323 | B2 | 6/2019 | Cheng |
| 10,388,569 | B1 | 8/2019 | Cheng |
| 2018/0294331 | A1* | 10/2018 | Cho ................. H01L 29/41725 |
| 2021/0280688 | A1* | 9/2021 | Cheng ................. H01L 29/6656 |
| 2022/0181489 | A1* | 6/2022 | You ...................... H01L 29/775 |
| 2022/0384589 | A1* | 12/2022 | Su ..................... H01L 29/66545 |

* cited by examiner

*Primary Examiner* — Nilufa Rahim
(74) *Attorney, Agent, or Firm* — Michael A. Petrocelli (57) ABSTRACT

A semiconductor structure includes a first nanosheet fin extending vertically from a first region of a substrate corresponding to a logic device and a second nanosheet fin extending vertically from a second region of the substrate corresponding to an input/output device. The first nanosheet fin includes first semiconductor channel layers vertically stacked over the first region of the substrate, while the second nanosheet fin includes an alternating sequence of semiconductor sacrificial layers and second semiconductor channel layers. The semiconductor structure further includes an epitaxially grown encapsulation layer disposed only along sidewalls of the second nanosheet fin.

18 Claims, 6 Drawing Sheets

SIDEWALL EPITAXY ENCAPSULATION FOR NANOSHEET I/O DEVICE

BACKGROUND

The present invention generally relates to the field of complementary metal-oxide semiconductor (CMOS) devices, and more particularly to nanosheet field effect transistor devices.

Gate-all-around (GAA) field-effect transistors (FETs) such as nanosheet-based devices provide better electro-static control. Thus, a GAA device architecture helps meet the requirements for further aggressive device scaling.

Input/output (I/O) devices are an important component in many circuit designs. Traditionally, I/O devices have a thick gate dielectric which is generally formed by thermal oxidation of silicon. However, in nanosheet-based FETs, there is oftentimes not enough room to grow a thick oxide for I/O devices, since doing so can also increase gate dielectric thickness at the logic device region which may degrade device performance. Accordingly, improved designs and techniques for fabricating a nanosheet-based I/O device without degrading gate stack quality in the logic device region would be desirable.

SUMMARY

According to an embodiment of the present disclosure, a semiconductor structure includes a first nanosheet fin extending vertically from a first region of a substrate corresponding to a logic device, the first nanosheet fin including first semiconductor channel layers vertically stacked over the first region of the substrate, a second nanosheet fin extending vertically from a second region of the substrate corresponding to an input/output device, the second nanosheet fin including an alternating sequence of semiconductor sacrificial layers and second semiconductor channel layers, and an epitaxially grown encapsulation layer disposed along sidewalls of the second nanosheet fin.

According to another embodiment of the present disclosure, a semiconductor structure includes a first nanosheet fin extending vertically from a first region of a substrate corresponding to a logic device, the first nanosheet fin including first semiconductor channel layers vertically stacked over the first region of the substrate, a second nanosheet fin extending vertically from a second region of the substrate corresponding to an input/output device, the second nanosheet fin including an alternating sequence of semiconductor sacrificial layers and second semiconductor channel layers, an epitaxially grown encapsulation layer disposed along sidewalls of the second nanosheet fin, first shallow trench isolation regions on opposite sides of a portion of the first region of the substrate below the first semiconductor channel layers, second shallow trench isolation regions on opposite sides of a portion of the second region of the substrate below the alternating sequence of semiconductor sacrificial layers and second semiconductor channel layers, and an oxide layer above the second nanosheet fin and above an upper surface of the second shallow trench isolation regions.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

It is understood that although the disclosed embodiments include a detailed description of an exemplary nanosheet FET architecture having silicon and silicon germanium nanosheets, implementation of the teachings recited herein are not limited to the particular FET architecture described herein. Rather, embodiments of the present invention are capable of being implemented in conjunction with any other type of FET device now known or later developed.

As mentioned above, in nanosheet-based FETs, there is oftentimes not enough room to grow the thick oxide typically used as gate dielectric in I/O devices, since doing so can also increase gate dielectric thickness at the logic device region which may degrade device performance.

Thus, embodiments of the present disclosure provide improved input/output (I/O) device designs for gate-all-around (GAA) transistors and techniques for fabrication thereof without degrading logic device performance. Specifically, embodiments of the present disclosure provide a semiconductor structure, and a method of making the same, in which a thin silicon (Si) layer is epitaxially grown along sidewalls of the nanosheet stack disposed on an I/O region for encapsulating the silicon-germanium (SiGe) nanosheets prior to deposition of the thick oxide gate dielectric in the I/O region. Advantageously, the present techniques are fully compatible with complementary-metal oxide semiconductor (CMOS) processes. Embodiments by which the encapsulation layer can be formed in an I/O device(s) are described in detailed below by referring to the accompanying drawings in FIGS. 1-9.

Figure 1:
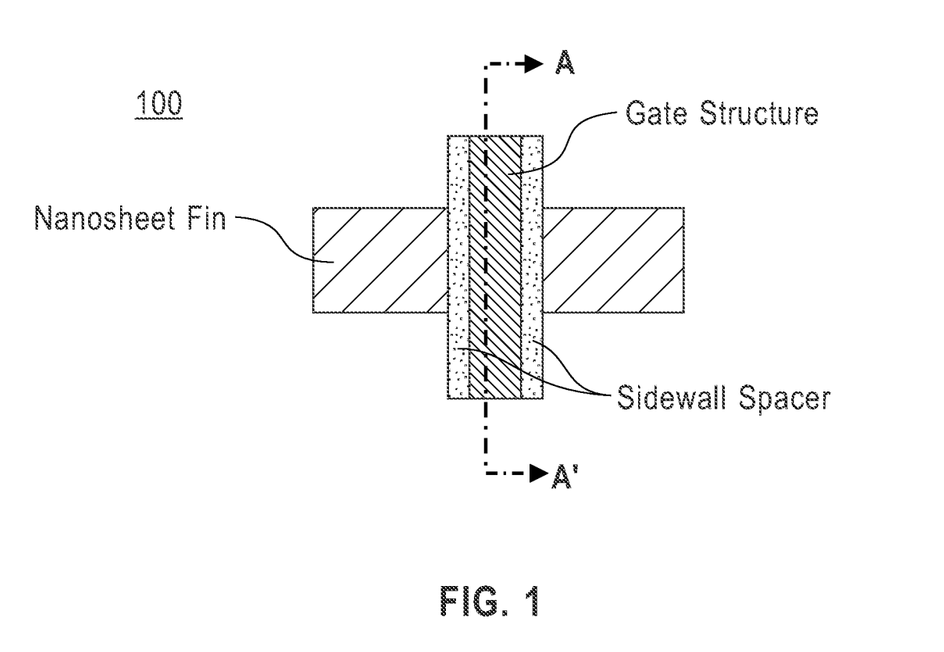
FIG. 1 is a top-down view of a semiconductor structure at an intermediate step during a semiconductor manufacturing process depicting different cross-sectional views, according to an embodiment of the present disclosure.

Referring now to FIG. 1, a top-down view of a semiconductor structure 100 is shown at an intermediate step during a semiconductor manufacturing process, according to an embodiment of the present disclosure. Particularly, FIG. 1 depicts a cross-sectional view of the semiconductor structure 100 that will be used to describe embodiments of the present disclosure. The cross-sectional view is taken along line A-A'. As depicted in the figure, line A-A' represents a cut along a gate structure or gate region of the semiconductor structure 100.

Figure 2:
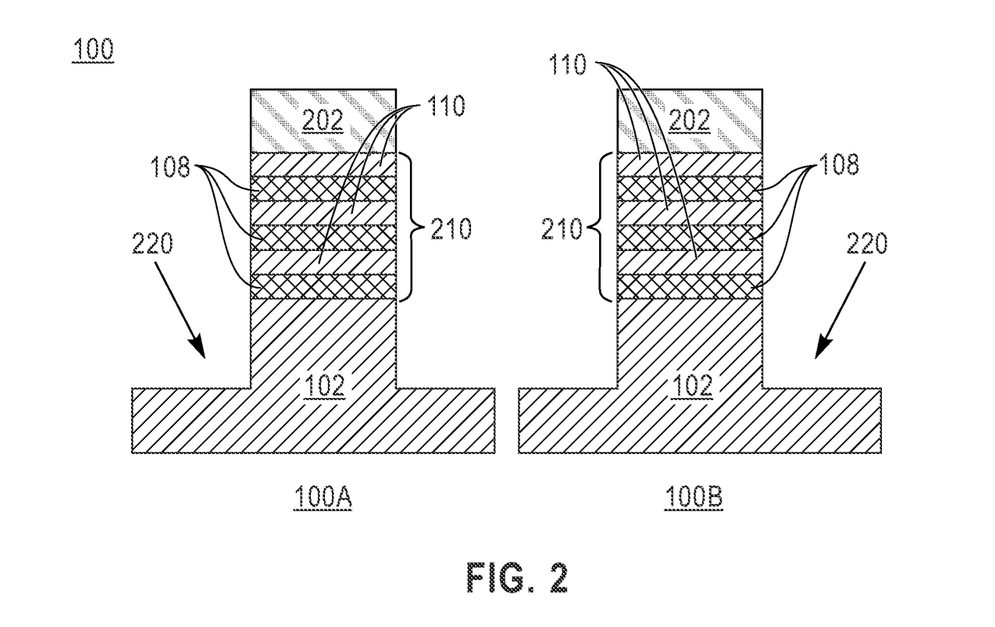
FIG. 2 is a cross-sectional view of the semiconductor structure taken along line A-A', as shown in FIG. 1, depicting forming a nanosheet fin, according to an embodiment of the present disclosure.

Referring now to FIG. 2, a cross-sectional view of the semiconductor structure 100 is shown after forming a nanosheet fin 210 extending vertically from a semiconductor substrate 102, according to an embodiment of the present disclosure. In this embodiment, FIG. 2 is a cross-sectional view of the semiconductor structure 100 taken along line A-A', as depicted in FIG. 1.

In one or more embodiments, the semiconductor structure 100 represents an integrated circuit (IC) having a logic device(s) 100A and an I/O device(s) 100B. As known by those skilled in the art, at least one logic device 100A and at least one I/O device 100B can be formed on a common wafer.

At this step of the manufacturing process, a nanosheet stack including an alternating sequence of layers of sacrificial semiconductor material and layers of semiconductor channel material vertically stacked one on top of another in a direction perpendicular to the semiconductor substrate 102 can be formed in the logic device 100A and I/O device 100B. In the example depicted in the figure, alternating sacrificial semiconductor layers 108 and semiconductor channel layers 110 are formed in a stack above the semiconductor substrate 102 in each of the logic device 100A and I/O device 100B.

The term sacrificial, as used herein, means a layer or other structure, that is (or a part thereof is) removed before completion of the final device. For instance, in the example being described, portions of the sacrificial semiconductor layers 108 will be removed from the stack in the channel region of the device to permit the semiconductor channel layers 110 to be released from the nanosheet stack 10. It is notable that while in the present example the sacrificial semiconductor layers 108 and the semiconductor channel layers 110 are made of silicon germanium (SiGe) and silicon (Si), respectively, any combination of sacrificial and channel materials may be employed in accordance with the present techniques. For example, one might instead employ selective etching technology which permits Si to be used as the sacrificial material between SiGe channel layers.

According to an embodiment, the semiconductor substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the semiconductor substrate 102 may be approximately, but is not limited to, several hundred microns thick. In other embodiments, the semiconductor substrate 102 may be a layered semiconductor such as a silicon-on-insulator or SiGe-on-insulator, where a buried insulator layer, separates a base substrate from a top semiconductor layer.

In general, layers of the nanosheet stack (e.g., SiGe/Si layers) can be formed by epitaxial growth by using the semiconductor substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the alternating sequence of SiGe/Si layers in the nanosheet stack. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

With continued reference to FIG. 2, the sacrificial semiconductor layers 108 are formed by epitaxially growing a layer of SiGe. The germanium concentration of the sacrificial semiconductor layers 108 varies from approximately 15 atomic percent to approximately 50 atomic percent.

To continue building the nanosheet stack, the semiconductor channel layers 110 are formed by epitaxially growing a Si layer. As depicted in the figure, the nanosheet stack is grown by forming (SiGe) sacrificial semiconductor layers 108 and (Si) semiconductor channel layers 110 in an alternating manner. Accordingly, each of the sacrificial semiconductor layers 108 and the semiconductor channel layers 110 in each of the logic device 100A and I/O device 100B can be formed in the same manner as described above, e.g., using an epitaxial growth process, to a thickness varying from approximately 4 nm to approximately 10 nm, although other thicknesses are within the contemplated scope of the invention.

Thus, each of the layers in the nanosheet stack 10 have nanoscale dimensions, and thus can also be referred to as nanosheets. In one or more embodiments, the (Si) semiconductor channel layers 110 will be used to form the channel layers of the device. Consequently, the dimensions of the semiconductor channel layers 110 dictate the dimensions of the channel region of the semiconductor structure 100. Further, the term "nanosheet(s)" may also be used interchangeably herein with the term "nanowire(s)" when referring to a particular structure. For instance, nanosheet can be used to refer to a nanowire with a larger width, and/or nanowire may be used to refer to a nanosheet with a smaller width, and vice versa.

As mentioned above, the goal is to produce a stack of alternating (sacrificial and channel) SiGe and Si layers on the wafer. The number of layers in the stack can be tailored depending on the particular application. Thus, the configurations depicted and described herein are merely examples meant to illustrate the present techniques. For instance, the present nanosheet stack that will be used to form the nanosheet fin 210 can contain more or fewer layers than are shown in the figures.

In one or more embodiments, the formed nanosheet stack can be used to produce a gate-all-around device that includes vertically stacked semiconductor channel material nanosheets for a positive channel Field Effect Transistor (hereinafter "p-FET") or a negative channel Field Effect Transistor (hereinafter "n-FET") device.

With continued reference to FIG. 2, known processing techniques have been applied to the sequence of (SiGe) sacrificial semiconductor layers 108 and (Si) semiconductor channel layers 110 to form the nanosheet fin 210 in each of the logic device 100A and I/O device 100B, as depicted in the figure. For example, a fin hardmask 202 is formed over the nanosheet stack composed by the sequence of (SiGe) sacrificial semiconductor layers 108 and (Si) semiconductor channel layers 110. The fin hardmask 202 can be formed by first depositing a hard mask material (e.g., silicon nitride) using, for example, chemical vapor deposition (CVD), plasma enhanced CVD (PECVD) or any suitable technique for dielectric deposition. A photolithographic patterning is conducted on the deposited hardmask material to form a plurality of individual fin hardmasks. The patterning of the fin hardmask 202 is commensurate with a desired footprint and location of the semiconductor channel layers 110, which will be used to form the channel regions of the semiconductor device. According to an exemplary embodiment, reactive ion etching (RIE) is used to etch through the sacrificial semiconductor layers 108 and the semiconductor channel layers 110 to form the nanosheet fin 210.

In one or more embodiments, portions of the semiconductor substrate 102 can also be removed during the etching step to form STI trenches 220 on opposite sides of the nanosheet fin 210, as depicted in the figure. It should be noted that portions of the semiconductor substrate 102 removed during the photolithographic patterning process are subsequently filled with an insulating material to form STI regions, as will be described in detail below with reference to FIG. 3 and FIG. 4.

Etching generally refers to the removal of a material from a substrate (or structures formed on the substrate), and is often performed with a mask in place so that material may selectively be removed from certain areas of the substrate, while leaving the material unaffected, in other areas of the substrate. There are generally two categories of etching, (i) wet etch and (ii) dry etch. Wet etch is performed with a solvent (such as an acid) which may be chosen for its ability to selectively dissolve a given material (such as oxide), while, leaving another material (such as polysilicon) relatively intact. This ability to selectively etch given materials is fundamental to many semiconductor fabrication processes. A wet etch will generally etch a homogeneous material (e.g., oxide) isotropically, but a wet etch may also etch single-crystal materials (e.g., silicon wafers) anisotropically. Dry etch may be performed using a plasma. Plasma systems can operate in several modes by adjusting the parameters of the plasma. Ordinary plasma etching produces energetic free radicals, neutrally charged, that react at the surface of the wafer. Since neutral particles attack the wafer from all angles, this process is isotropic. Ion milling, or sputter etching, bombards the wafer with energetic ions of noble gases which approach the wafer approximately from one direction, and therefore this process is highly anisotropic. RIE operates under conditions intermediate between sputter and plasma etching and may be used to produce deep, narrow features, such as the STI trenches 220.

Figure 3:
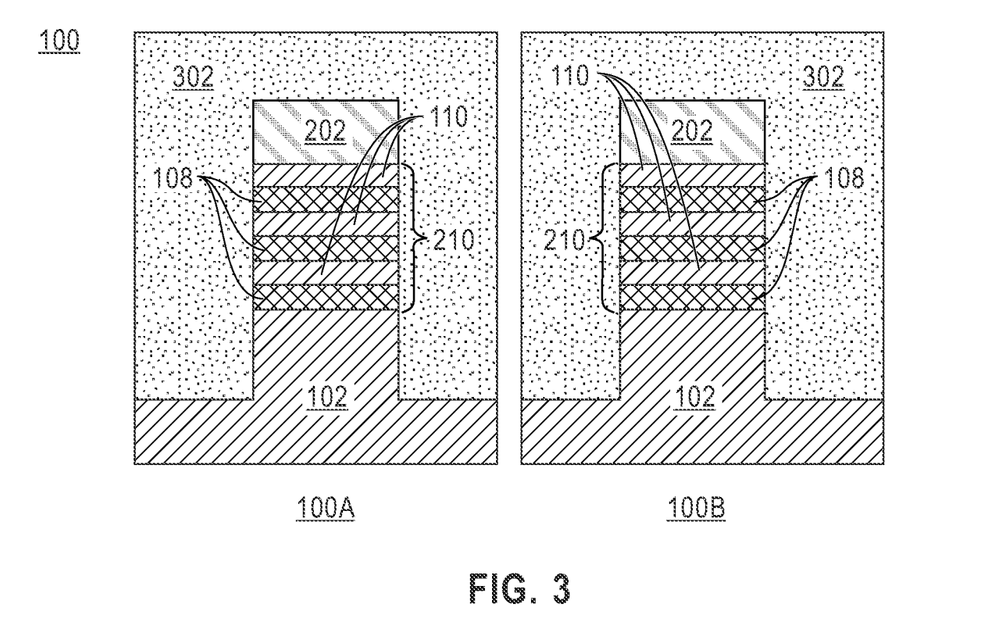
FIG. 3 is a cross-sectional view of the semiconductor structure taken along line A-A', as shown in FIG. 1, depicting depositing a dielectric material, according to an embodiment of the present disclosure.
Figure 4:
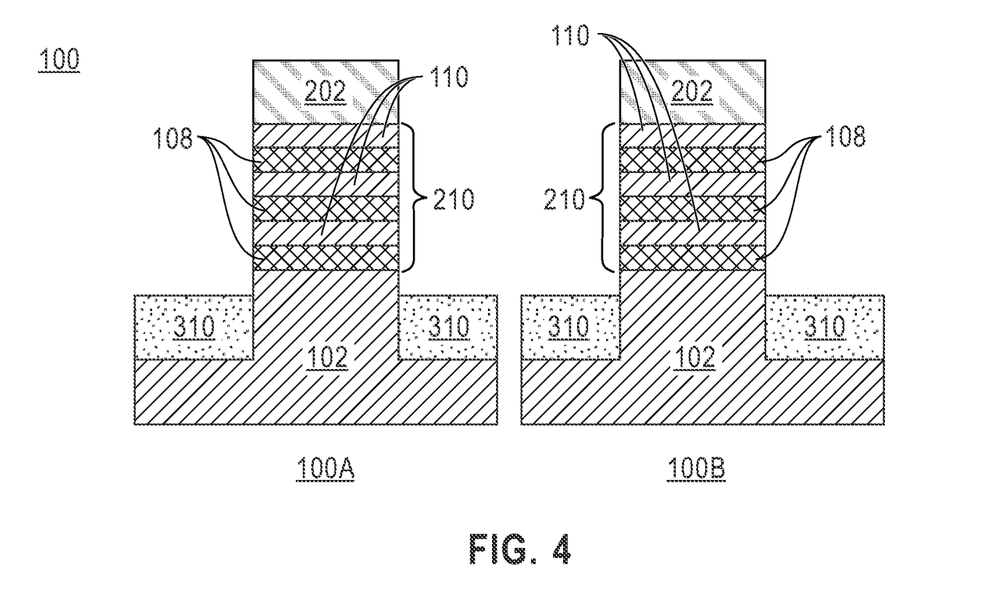
FIG. 4 is a cross-sectional view of the semiconductor structure taken along line A-A', as shown in FIG. 1, depicting forming shallow trench isolation regions, according to an embodiment of the present disclosure.

Referring now to FIG. 3 and FIG. 4 simultaneously, cross-sectional views of the semiconductor structure 100 are shown after depositing a dielectric material 302 and forming STI regions 310, according to an embodiment of the present disclosure. In this embodiment, FIGS. 3-4 are cross-sectional views of the semiconductor structure 100 taken along line A-A', as depicted in FIG. 1.

The process of forming the STI regions 310 is standard and well-known in the art, it typically involves depositing the dielectric material 302 to substantially fill areas of the semiconductor structure 100 between adjacent (not shown) nanosheet fins 210 (i.e., STI trenches 220) for electrically isolating the nanosheet fin(s) 210 in each of the logic device 100A and I/O device 100B. The STI regions 310 may be formed by, for example, CVD of the dielectric material 302. Non-limiting examples of dielectric materials to form the STI regions 310 include silicon oxide, silicon nitride, hydrogenated silicon carbon oxide, silicon based low-k dielectrics, flowable oxides, porous dielectrics, or organic dielectrics including porous organic dielectrics.

According to an embodiment, the dielectric material 302 can be subsequently etched using, for example, RIE to form the STI regions 310 and reveal the nanosheet fin 210, as depicted in FIG. 4.

Figure 5:
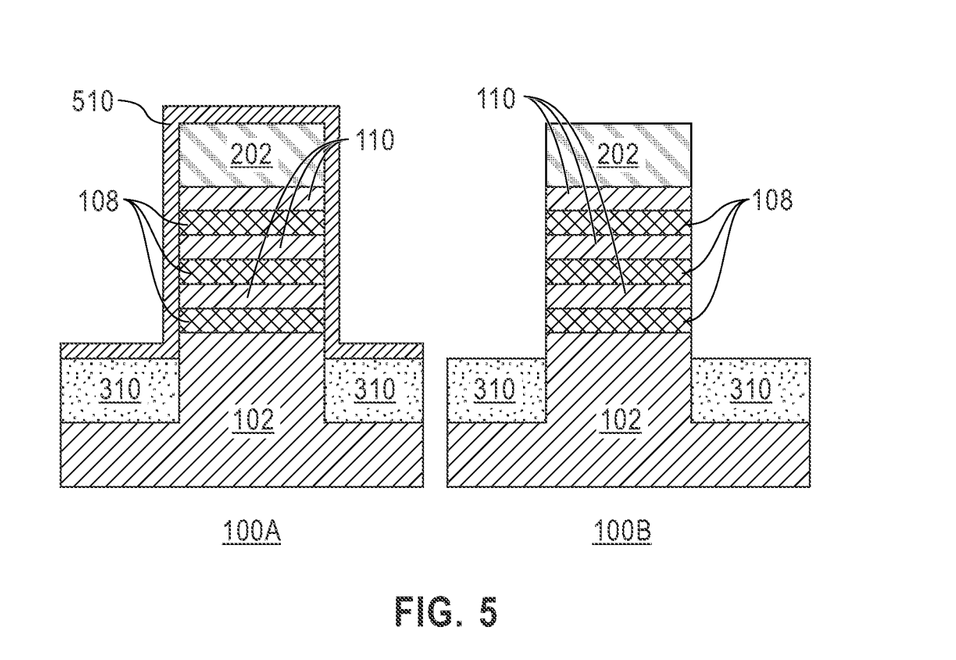
FIG. 5 is a cross-sectional view of the semiconductor structure taken along line A-A', as shown in FIG. 1, depicting forming a first masking layer on a logic device, according to an embodiment of the present disclosure.

Referring now to FIG. 5, a cross-sectional view of the semiconductor structure 100 is shown after forming a first masking layer 510 on the logic device 100A, according to an embodiment of the present disclosure. In this embodiment, FIG. 5 is a cross-sectional view of the semiconductor structure 100 taken along line A-A', as depicted in FIG. 1.

The first masking layer 510 is formed over or covering the logic device 100A for protecting the logic device 100A during subsequent processing steps conducted on the I/O device 100B. The process of forming the first masking layer 510 is standard and well-known in the art. In an exemplary embodiment, the first masking layer 510 may include a layer of nitride, a layer of oxide and/or a layer of oxide-over-nitride. The first masking layer 510 may have a thickness in the range of about 5 nm to about 150 nm. The first masking layer 510 can be selectively removed from the I/O device 100B using conventional photoresist and etching techniques.

It should be noted that some elements and/or features of the semiconductor structure 100 are illustrated in the figures but not described in detail in order to avoid unnecessarily obscuring the presented embodiments.

Figure 6:
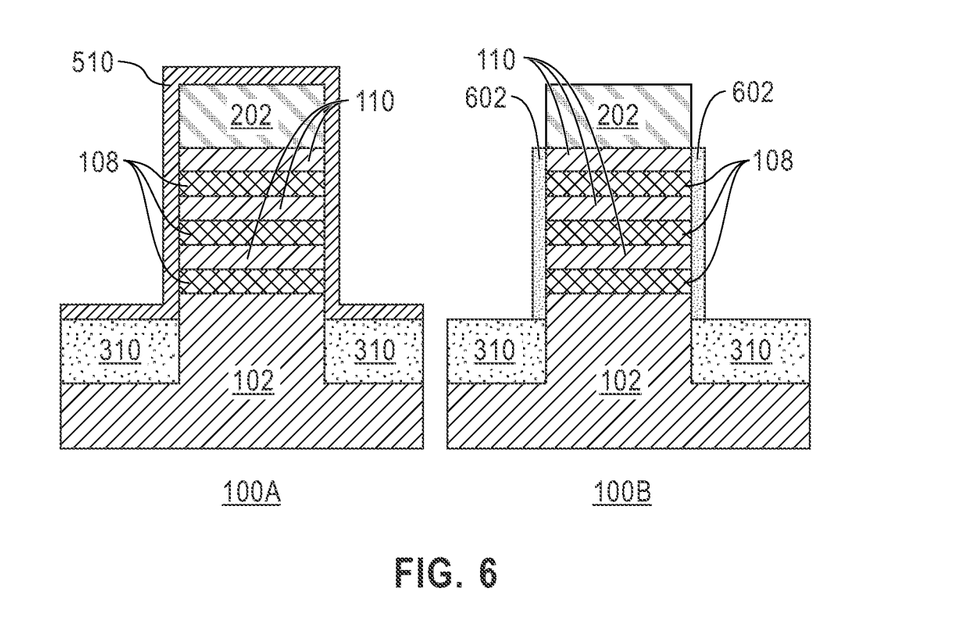
FIG. 6 is a cross-sectional view of the semiconductor structure taken along line A-A', as shown in FIG. 1, depicting forming an encapsulation layer on an I/O device, according to an embodiment of the present disclosure.

Referring now to FIG. 6, a cross-sectional view of the semiconductor structure 100 is shown after forming an encapsulation layer 602 on the I/O device 100B, according to an embodiment of the present disclosure. In this embodiment, FIG. 6 is a cross-sectional view of the semiconductor structure 100 taken along line A-A', as depicted in FIG. 1.

The encapsulation layer 602 includes a layer of an epitaxially grown semiconductor material. In the depicted example, the encapsulation layer 602 is composed of a thin layer of epitaxially grown silicon (Si). In one or more embodiments, the (Si) encapsulation layer 602 can be formed in the same manner as the sacrificial semiconductor layers 108 and the semiconductor channel layers 110, i.e., using an epitaxial growth process, to a (horizontal) thickness varying from approximately 1 nm to approximately 10 nm, although other thicknesses are within the contemplated scope of the invention.

Accordingly, as depicted in the figure, the encapsulation layer 602 is formed along sidewalls of the nanosheet fin 210 substantially covering the sacrificial semiconductor layers 108 and the semiconductor channel layers 110 of the I/O device 100B. By forming the encapsulation layer 602 along sidewalls of the nanosheet fin 210 in the I/O device 100B, a thick oxide gate dielectric can be subsequently formed in the I/O region without degrading the performance of the logic device 100A.

Figure 7:
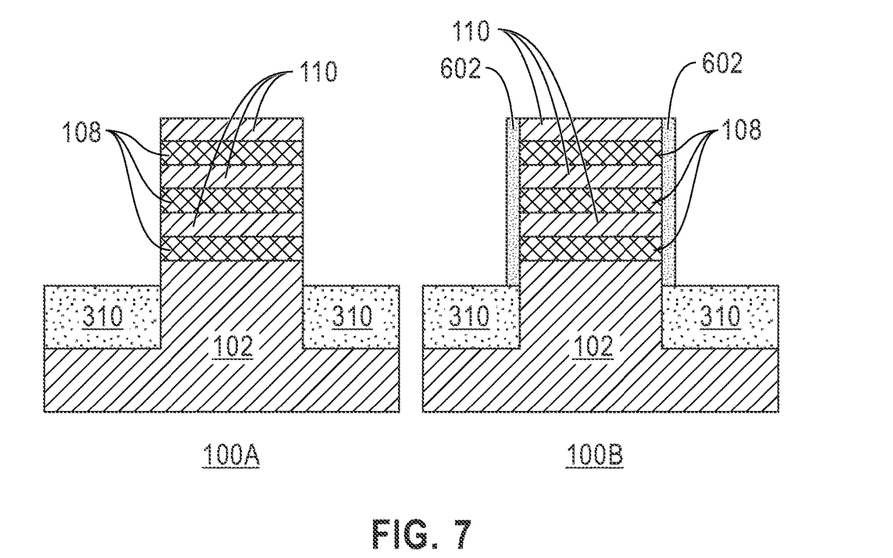
FIG. 7 is a cross-sectional view of the semiconductor structure taken along line A-A', as shown in FIG. 1, depicting removing the first masking layer and a fin hardmask, according to an embodiment of the present disclosure.

Referring now to FIG. 7, a cross-sectional view of the semiconductor structure 100 is shown after removing the first masking layer 510 and the fin hardmask 202, according to an embodiment of the present disclosure. In this embodiment, FIG. 7 is a cross-sectional view of the semiconductor structure 100 taken along line A-A', as depicted in FIG. 1.

Any suitable etching techniques (e.g., RIE) can be used to selectively remove the first masking layer 510 from the logic device 100A and the fin hardmask 202 from each of the logic device 100A and I/O device 100B. As depicted in the figure, the encapsulation layer 602 remain in the I/O device 100B substantially covering sidewalls of the fin nanosheet 210.

Figure 8:
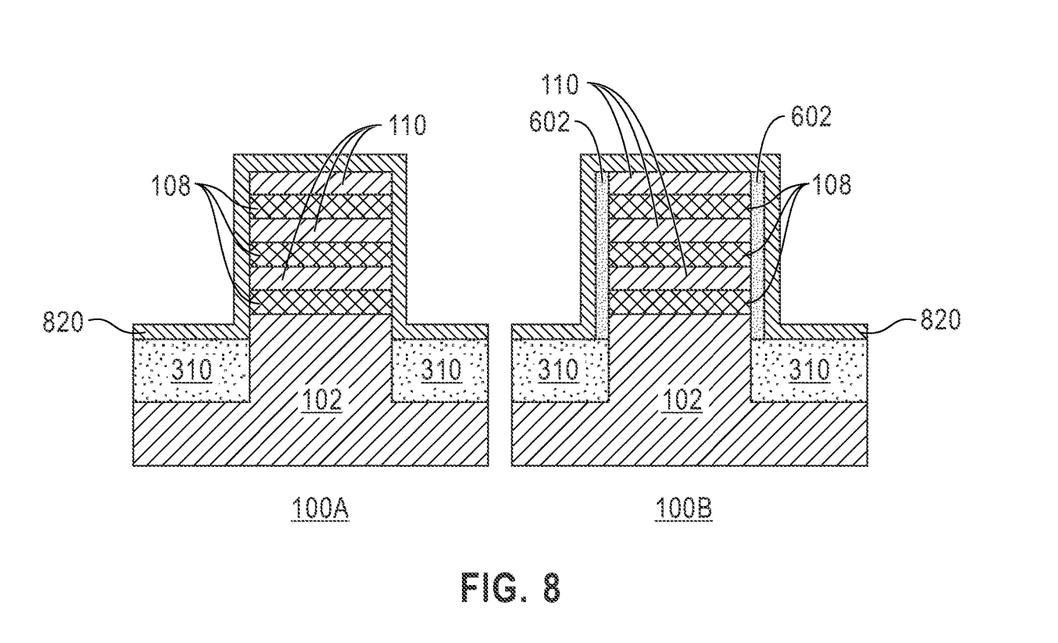
FIG. 8 is a cross-sectional view of the semiconductor structure taken along line A-A', as shown in FIG. 1, depicting forming an oxide layer, according to an embodiment of the present disclosure.

Referring now to FIG. 8, a cross-sectional view of the semiconductor structure 100 is shown after forming an oxide layer 820, according to an embodiment of the present disclosure. In this embodiment, FIG. 8 is a cross-sectional view of the semiconductor structure 100 taken along line A-A', as depicted in FIG. 1.

The oxide layer 820 may be conformally deposited on each of the logic device 100A and I/O device 100B using, for example, atomic layer deposition (ALD) or chemical vapor deposition (CVD). Non-limiting examples of oxide materials suitable for forming the oxide layer 820 include $SiO_2$, SiON, and the like. According to an exemplary embodiment, a thickness of the oxide layer 820 may vary from approximately 1 nm to approximately 5 nm, and ranges therebetween.

Figure 9:
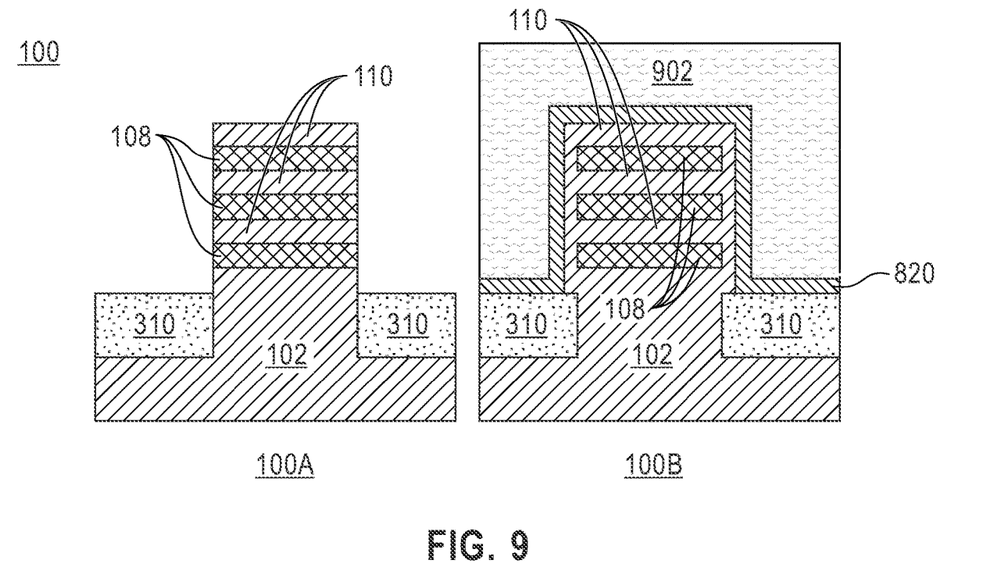
FIG. 9 is a cross-sectional view of the semiconductor structure taken along line A-A', as shown in FIG. 1, depicting forming a second masking layer on the I/O device and selectively removing the oxide layer from the logic device, according to an embodiment of the present disclosure.

Referring now to FIG. 9, a cross-sectional view of the semiconductor structure 100 is shown after forming a second masking layer 902 on the I/O device 100B and selectively removing the oxide layer 820 from the logic device 100A, according to an embodiment of the present disclosure. In this embodiment, FIG. 9 is a cross-sectional view of the semiconductor structure 100 taken along line A-A', as depicted in FIG. 1.

The second masking layer 902 is formed over or covering the I/O device 100B for protecting the I/O device 100B during subsequent processing steps conducted on the logic device 100A. The process of forming the second masking layer 902 is standard and well-known in the art. In an exemplary embodiment, the second masking layer 902 may include a standard block mask. The next task is to selectively remove the oxide layer 820 from the logic device 100A, such that the oxide layer 820 remains in the I/O device 100B.

An etch process such as wets etching (HF) and dry etching can be used to remove the oxide layer 820 from the logic device 100A.

Figure 10:
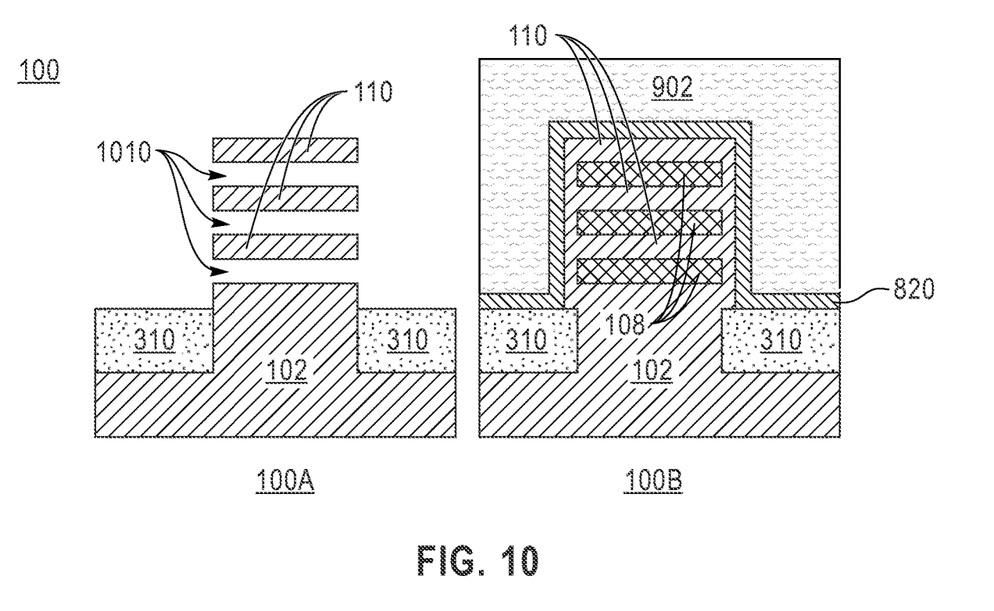
FIG. 10 is a cross-sectional view of the semiconductor structure taken along line A-A', as shown in FIG. 1, depicting removing the sacrificial semiconductor layers from the logic device, according to an embodiment of the present disclosure.

Referring now to FIG. 10, a cross-sectional view of the semiconductor structure 100 is shown after removing the sacrificial semiconductor layers 108 from the logic device 100A, according to an embodiment of the present disclosure. In this embodiment, FIG. 10 is a cross-sectional view of the semiconductor structure 100 taken along line A-A', as depicted in FIG. 1.

Following the removal of the oxide layer 820 from the logic device 100A, the sacrificial semiconductor layers 108 can be selectively removed from the logic device 100A. In an exemplary embodiment, the sacrificial semiconductor layers 108 can be removed from the logic device 100A by known etching processes including, for example, RIE, wet etch or dry gas (HCl). Removal of the sacrificial semiconductor layers 108 create recesses 1010 that will subsequently be filled with corresponding work function metals (i.e., high-k dielectric/metal gate stack), as will be described in detail below.

Figure 11:
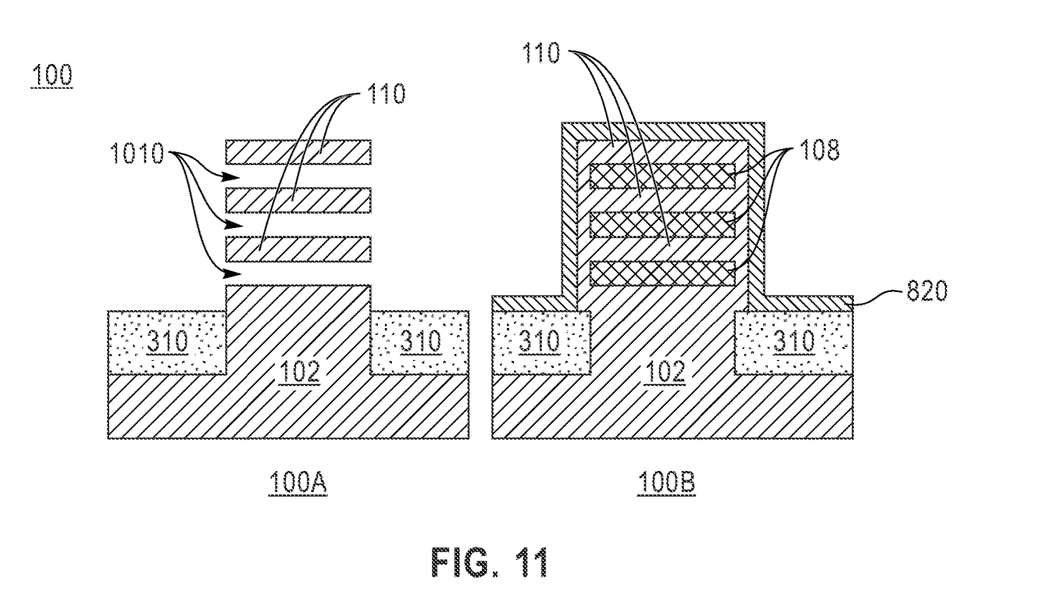
FIG. 11 is a cross-sectional view of the semiconductor structure taken along line A-A', as shown in FIG. 1, depicting removing the second masking layer from the I/O device, according to an embodiment of the present disclosure.

Referring now to FIG. 11, a cross-sectional view of the semiconductor structure 100 is shown after removing the second masking layer 902 from the I/O device 100B, according to an embodiment of the present disclosure. In this embodiment, FIG. 11 is a cross-sectional view of the semiconductor structure 100 taken along line A-A', as depicted in FIG. 1.

The second masking layer 902 can be selectively removed from the I/O device 100B using conventional photoresist and etching techniques.

Figure 12:
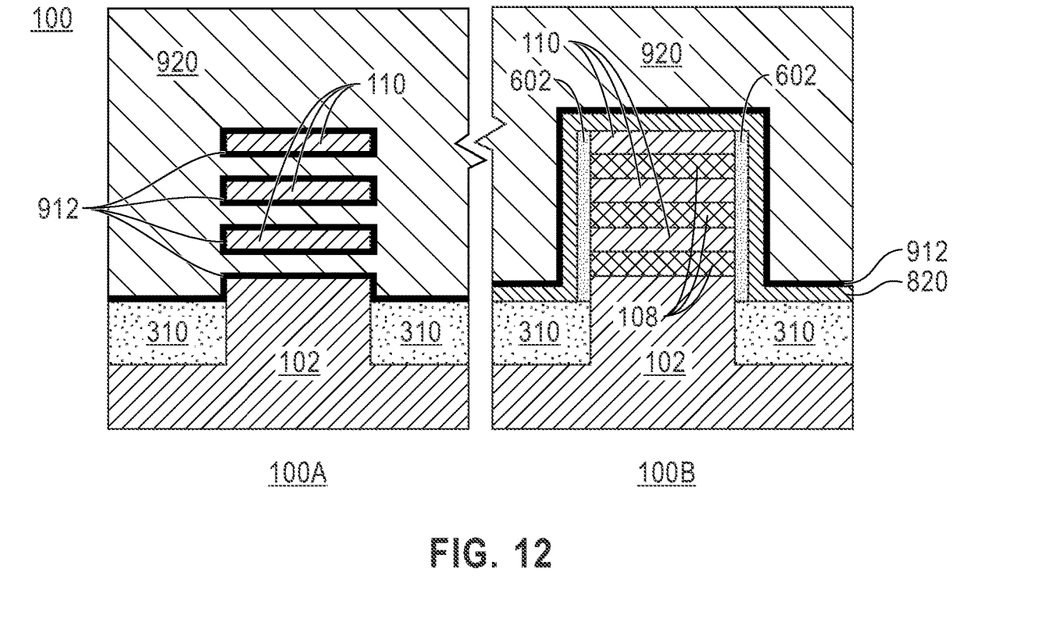
FIG. 12 is a cross-sectional view of the semiconductor structure taken along line A-A', as shown in FIG. 1, depicting conducting a replacement metal gate process, according to an embodiment of the present disclosure.

Referring now to FIG. 12, a cross-sectional view of the semiconductor structure 100 is shown after conducting a replacement metal gate (RMG) process, according to an embodiment of the present disclosure. In this embodiment, FIG. 12 is a cross-sectional view of the semiconductor structure 100 taken along line A-A', as depicted in FIG. 1.

At this step of the manufacturing process, known processing techniques have been applied to the semiconductor structure 100. It should be noted that standard processing steps are not described in detail in order to avoid unnecessarily obscuring the presented embodiments. As known by those skilled in the art, each logic device 100A and I/O device 100B is a transistor having a source region and a drain region interconnected by a channel region (i.e., semiconductor channel layers 110), and a gate that fully surrounds a portion of each of the nanosheets of channel material in a gate-all-around (GAA) configuration. The gate regulates electron flow through the channel region. In the present example, a gate-last, replacement metal gate or RMG process flow is employed whereby a sacrificial or dummy gate (not shown) is placed over the channel region early in the process which enables placement of the source and drain regions (not shown). The dummy gate is subsequently removed and replaced with a high-k dielectric 912 and a metal gate 920. Advantageously, a gate-last process avoids exposure of high-k dielectric/metal gate to potentially damaging conditions such as high processing temperatures that can impact device performance.

Thus, FIG. 12 depicts the semiconductor structure 100 after conducting the aforementioned steps in addition to forming the high-k dielectric 910 and the metal gate 920. Generally, the high-k dielectric 912 is formed within the recesses 1010 formed after removal of the sacrificial semiconductor layers 108 substantially surrounding the semiconductor channel layers 110. In some embodiments, the high-k dielectric 912 includes a layer of silicon oxide and a layer of a high-k dielectric material, such as a hafnium based material. The metal gate 920 is deposited above the high-k dielectric 910 to complete the gate formation. The metal gate 920 may include one or more work function metals such as, but not limited to, titanium nitride (TiN), tantalum nitride (TaN), titanium carbide (TiC), titanium aluminum carbide (TiAlC), and conducting metals including, for example, aluminum (Al), tungsten (W) or cobalt (Co). As can be appreciated in FIG. 12, the high-k dielectric 912/metal gate 920 substantially surround the (stacked) semiconductor channel layers 110. After forming the high-k dielectric 912/metal gate 920, a chemical mechanical polishing (CMP) may be conducted to remove excess material and polish upper surfaces of the semiconductor structure 100.

Therefore, the proposed embodiments provide a GGA device in which the (thick) oxide layer 820, typically used as gate dielectric in I/O devices, is removed from the logic device 100A while remaining in the I/O device 100B of the semiconductor structure 100 thereby improving device performance. This can be done due to the formation of the encapsulation layer 602 along sidewalls of the nanosheet stack 210 in the I/O device 100B.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure, comprising:
    a first nanosheet fin extending vertically from a first region of a substrate corresponding to a logic device, the first nanosheet fin including first semiconductor channel layers vertically stacked over the first region of the substrate;
    a second nanosheet fin extending vertically from a second region of the substrate corresponding to an input/output device, the second nanosheet fin including an alternating sequence of semiconductor sacrificial layers and second semiconductor channel layers vertically stacked over the second region of the substrate;
    an epitaxially grown encapsulation layer disposed along sidewalls of alternating sequence of semiconductor sacrificial layers and second semiconductor channel layers; and
    an oxide layer in contact with a top surface of an uppermost second semiconductor channel layer of the alternating sequence of semiconductor sacrificial layers and second semiconductor channel layers and in contact with opposite sidewalls of the encapsulation layer.

2. The semiconductor structure of claim 1, further comprising:
    a high-k dielectric layer surrounding and in contact with each of the first semiconductor channel layers in the first region of the substrate, the high-k dielectric layer being disposed above and in direct contact with the oxide layer in the second region of the substrate.

3. The semiconductor structure of claim 2, wherein the oxide layer is composed of an oxide material including SiO2 and SiON.

4. The semiconductor structure of claim 2, wherein a thickness of the oxide layer is between 1-5 nm.

5. The semiconductor structure of claim 2, further comprising:
    a metal gate above and in direct contact with the high-k dielectric layer.

6. The semiconductor structure of claim 1, wherein the first semiconductor channel layers and the second semiconductor channel layers comprise silicon.

7. The semiconductor structure of claim 1, wherein the semiconductor sacrificial layers comprise silicon-germanium.

8. The semiconductor structure of claim 1, wherein the epitaxially grown encapsulation layer comprises silicon epitaxially grown off the second semiconductor channel layers.

9. The semiconductor structure of claim 1, wherein a thickness of the epitaxially grown encapsulation layer is between 1-10 nm.

10. The semiconductor structure of claim 1, further comprises:
    a portion of the first region of the substrate below the first semiconductor channel layers being located between first shallow trench isolation regions; and
    a portion of the second region of the substrate below the alternating sequence of semiconductor sacrificial layers and second semiconductor channel layers being located between second shallow trench isolation regions, wherein the oxide layer is located above the second shallow trench isolation regions.

11. A semiconductor structure, comprising:
    a first nanosheet fin extending vertically from a first region of a substrate corresponding to a logic device, the first nanosheet fin including first semiconductor channel layers vertically stacked over the first region of the substrate;
    a second nanosheet fin extending vertically from a second region of the substrate corresponding to an input/output device, the second nanosheet fin including an alternating sequence of semiconductor sacrificial layers and second semiconductor channel layers vertically stacked over the second region of the substrate;
    an epitaxially grown encapsulation layer disposed along sidewalls of the alternating sequence of semiconductor sacrificial layers and second semiconductor channel layers;
    first shallow trench isolation regions on opposite sides of a portion of the first region of the substrate below the first semiconductor channel layers;
    second shallow trench isolation regions on opposite sides of a portion of the second region of the substrate below the alternating sequence of semiconductor sacrificial layers and second semiconductor channel layers; and
    an oxide layer in contact with a top surface of an uppermost second semiconductor channel layer of the alternating sequence of semiconductor sacrificial layers and second semiconductor channel layers and in contact with opposite sidewalls of the encapsulation layer.

12. The semiconductor structure of claim 11, wherein the oxide layer is composed of an oxide material including SiO2 and SiON.

13. The semiconductor structure of claim 11, wherein a thickness of the oxide layer is between 1-5 nm.

14. The semiconductor structure of claim 11, wherein the first semiconductor channel layers and the second semiconductor channel layers comprise silicon, and the semiconductor sacrificial layers comprise silicon-germanium.

15. The semiconductor structure of claim 11, wherein the epitaxially grown encapsulation layer comprises silicon epitaxially grown off the second semiconductor channel layers.

16. The semiconductor structure of claim 11, wherein a thickness of the epitaxially grown encapsulation layer is between 1-10 nm.

17. The semiconductor structure of claim 11, further comprising:
- a first high-k dielectric layer surrounding each of the first semiconductor channel layers in the first region of the substrate; and
- a first metal gate above and in direct contact with the first high-k dielectric layer.

18. The semiconductor structure of claim 11, further comprising:
- a second high-k dielectric layer disposed above and in direct contact with the oxide layer in the second region of the substrate; and
- a second metal gate above and in direct contact with the second high-k dielectric layer.

* * * * *